United States Patent [19]

Oogita

[11] Patent Number: 5,065,084
[45] Date of Patent: Nov. 12, 1991

[54] ELECTRONIC EQUIPMENT HAVING DISPLAY DEVICE FOR DISPLAYING LIFETIME OF POWER SOURCE

[75] Inventor: Yoshinori Oogita, Nara, Japan

[73] Assignee: Sharp Kabushiki Kaisha, Japan

[21] Appl. No.: 547,217

[22] Filed: Jul. 3, 1990

[30] Foreign Application Priority Data

Aug. 8, 1989 [JP] Japan .................................. 64-205132

[51] Int. Cl.⁵ .......................................... H01M 10/48
[52] U.S. Cl. ........................................ 320/48; 340/636;
377/16; 377/15; 377/112; 368/10; 368/204;
368/244; 368/251
[58] Field of Search ...................... 377/16, 15, 32, 112;
340/636; 307/296.3; 368/9, 10, 203, 204, 244,
251; 320/48

[56] References Cited

U.S. PATENT DOCUMENTS

| | | | |
|---|---|---|---|
| 3,672,154 | 6/1972 | Hubner | 368/204 |
| 4,180,724 | 12/1979 | Councilman et al. | 377/16 |
| 4,380,726 | 4/1983 | Sado et al. | 340/636 |
| 4,678,998 | 7/1987 | Muramatsu | 320/48 |
| 4,743,831 | 5/1988 | Young | 340/636 |
| 4,800,336 | 1/1989 | Mikami et al. | 320/48 |

*Primary Examiner*—John S. Heyman
*Attorney, Agent, or Firm*—Nixon & Vanderhye

[57] ABSTRACT

An electronic equipment using a battery as an energizing power source includes a display unit, a signal generator for generating operation clocks while the electronic equipment is being actuated, a counter for measuring the number of the clocks, a calculator for calculating an operating time of the battery based upon the result of the counting operation by the counter, an estimating unit for estimating a consumption state of the battery based upon the result of the calculation by the calculator, and an informing unit for making the display unit display beforehand the expiration of the lifetime of the battery based upon the result of the estimation by the estimating unit.

3 Claims, 4 Drawing Sheets

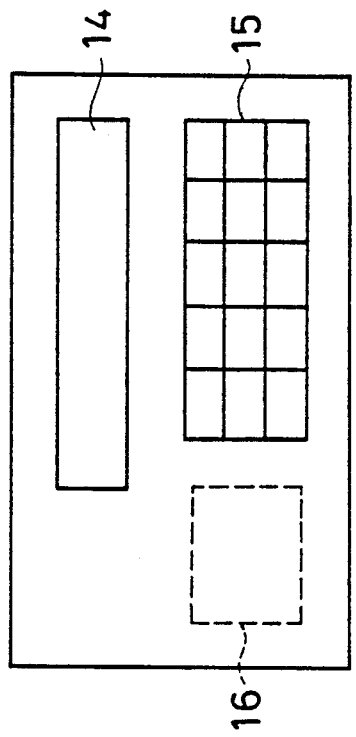
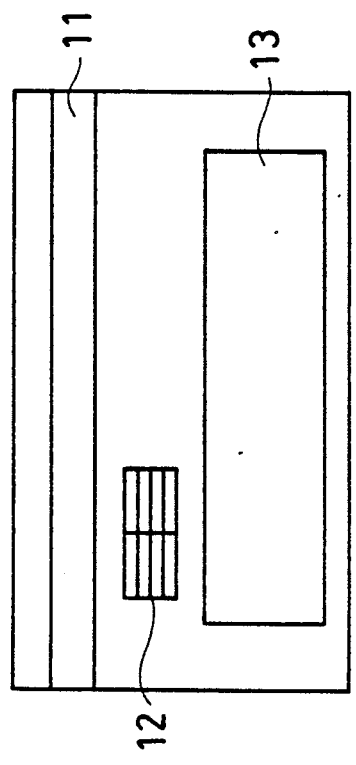

& 1

ELECTRONIC EQUIPMENT HAVING DISPLAY DEVICE FOR DISPLAYING LIFETIME OF POWER SOURCE

BACKGROUND OF THE INVENTION

1. Field of the Invention

The present invention relates to an electronic equipment using a battery as a power source, and more specifically, it relates to an electronic equipment provided with a display unit having a function of displaying the expiration of the lifetime of a battery.

2. Description of the Prior Art

An IC card capable of information processing requires a power source. As the power source, a lithium battery is generally used, but its voltage-fall is a cause of a malfunction of the IC card. Hence, in an IC card with a display unit, the display unit is utilized to display the expiration of the lifetime of the battery (see Unexamined Japanese Utility Model Publication No. 182740/1984).

FIG. 6 shows a structure of a conventional IC card with a display unit, which has a function of displaying the expiration of the lifetime of a battery. Voltage V of a battery 16 energizing an LSI 21 of the IC card is detected by voltage detecting circuits 22 and 23. The first voltage detecting circuit 22 informs beforehand of the expiration of the lifetime of the battery and detects voltage $V_1$ somewhat lower than a rated voltage $V_0$ of the battery 16 (see FIG. 7). When the first voltage detecting circuit 22 detects the voltage $V_1$, the LSI 21 makes a display unit 24 inform beforehand that the lifetime of the battery has almost expired. The second voltage detecting circuit 23 detects voltage $V_2$ lower than the voltage $V_1$ to inform of the expiration of the lifetime of the battery 16 (see FIG. 7). As the detection is completed, the LSI 21 makes the display unit 24 display to inform of the expiration of the lifetime of the battery 16. When the voltage V of the battery 16 gets lower than the voltage $V_2$, the LSI 21 exercises a malfunction.

Such a conventional IC card with a display unit having a function of displaying the expiration of the lifetime of a battery can inform of the expiration of the lifetime of the battery but cannot substantially perform a function of informing beforehand. This is because voltage V of a lithium battery generally employed in IC cards, as shown in FIG. 7, rapidly falls near the expiration of the lifetime, and although the voltage V is detected double-stepwise ($V_1$, $V_2$) by the two kinds of voltage detecting circuits 22 and 23, there is little difference between respective detection times $t_1$ and $t_2$. Thus, even when the display unit 24 displays to inform beforehand of the expiration of the lifetime of the battery, a trifling delay in battery exchange causes a malfunction in the LSI 21.

SUMMARY OF THE INVENTION

The present invention provides an electronic equipment using a battery as an energizing power source, comprising a display unit, signal generating means for generating operation clocks while the electronic equipment is being actuated, counting means for measuring the number of the clocks, calculating means for calculating an operating time of the battery based upon the result of the counting operation by the counting means, estimating means for estimating a consumption state of the battery based upon the result of the calculation by the calculating means, and informing means for making the display unit display beforehand the expiration of the lifetime of the battery based upon the result of the estimation by the estimating means.

Preferably, the estimating means estimates a consumption state of the battery based upon current outputted from the battery.

The electronic equipment may further comprises timer means for measuring the total time for which the battery has been held, while the estimating means may estimate a consumption state of the battery based upon current outputted from the battery while the operation clocks are being generated and current outputted while they are not being generated.

The counting means and the timer means are preferably reset by an exchange of the battery.

BRIEF DESCRIPTION OF THE DRAWINGS

FIG. 1 is a block diagram for explaining a structure of the present invention;

FIG. 2 is an elevational view showing an IC card of an embodiment according to the present invention;

FIG. 3 is a rear elevation view of the IC card in FIG. 2;

DESCRIPTION OF THE PREFERRED EMBODIMENTS

Figure 4:
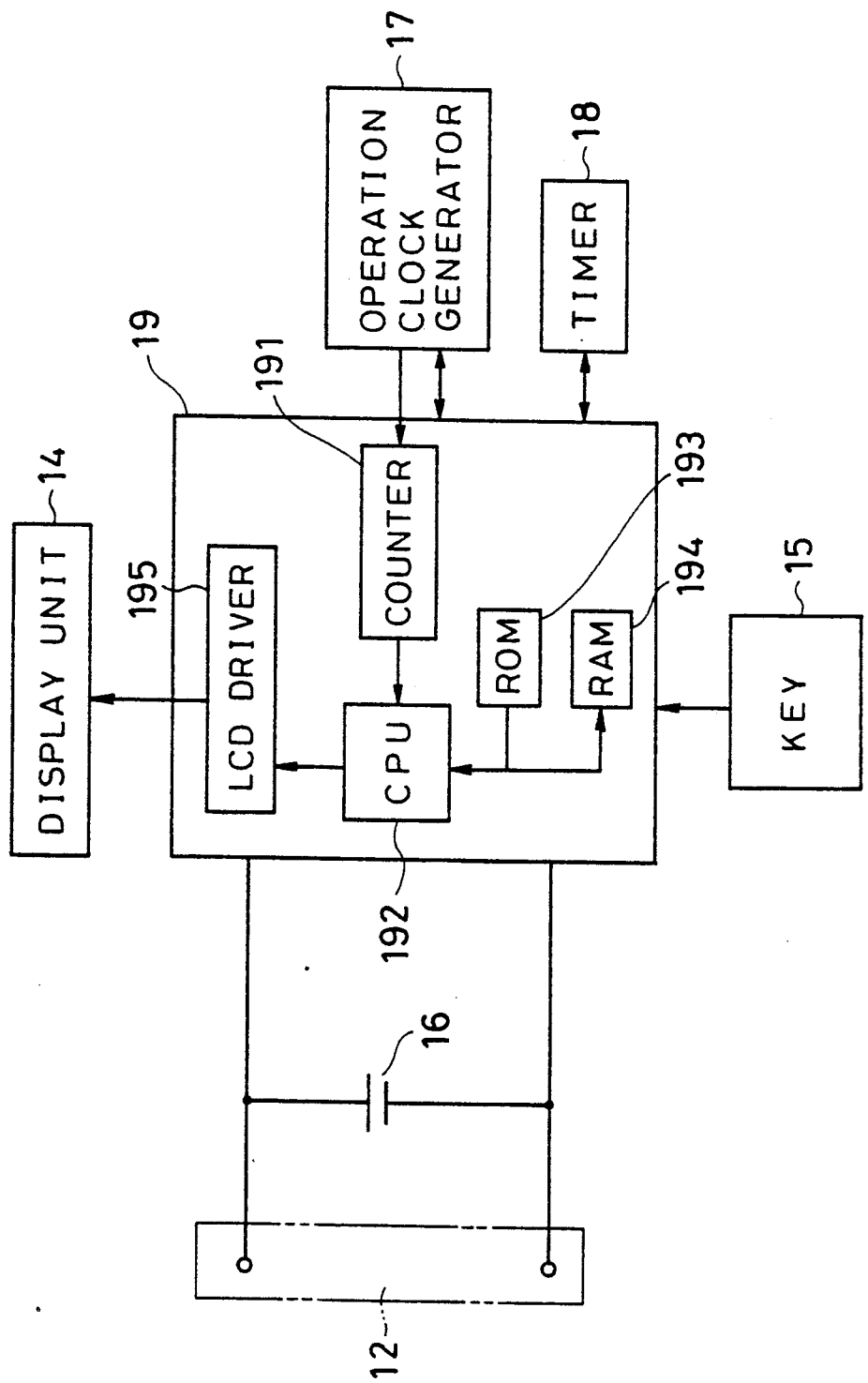
FIG. 4 is a block diagram for explaining inner circuitry of the IC card.

An electronic equipment of an embodiment according to the present invention, which is an IC card with a display unit, will now be described.

The IC card according to the present invention, as shown in FIG. 2, has a magnetic stripe area 11, an 8-PIN terminal area 12 and an embossed area 13 on its surface. On the bottom surface of the IC card, as shown in FIG. 3, a display unit 14 and keys 15 are provided, while in its inner part, a battery 16 is held.

Inner circuitry of the IC card is made up of an operation clock generating circuit 17, a timer 18 and an LSI 19, as shown in FIG. 4. The LSI 19 includes a counter 191, a CPU 192, a ROM 193, a RAM 194 and an LCD driver 195 and is energized by the battery 16. The operation clock generating circuit 17 generates operation clocks while the IC card is being actuated, but not while the IC card is on standby. The counter 191 of the LSI 19 cumulatively counts the operation clocks generated by the operation clock generating circuit 17 and a count value is reset through an exchange of the battery 16. The timer 18 measures the total time for which the battery 16 has been held in the IC card, and a measured value is reset through an exchange of the battery 16 similar to the counter 191. The CPU 192 of the LSI 19 receives information from the magnetic stripe area 11, the keys 15, the counter 191 and the timer 18 and performs a predetermined data processing on the information. Output of the CPU 192 is transmitted to the outside of the circuitry through the terminal area 12, while it is also inputted to the LCD driver 195 to make the display unit 14 made up of an LCD display the information. The counter 191 of the LSI 19 corresponds to the counting means shown in FIG. 1. The battery 16 is also connected to the 8-PIN terminal area 12 so that its voltage can be extracted to the outside of the circuitry.

Figure 5:
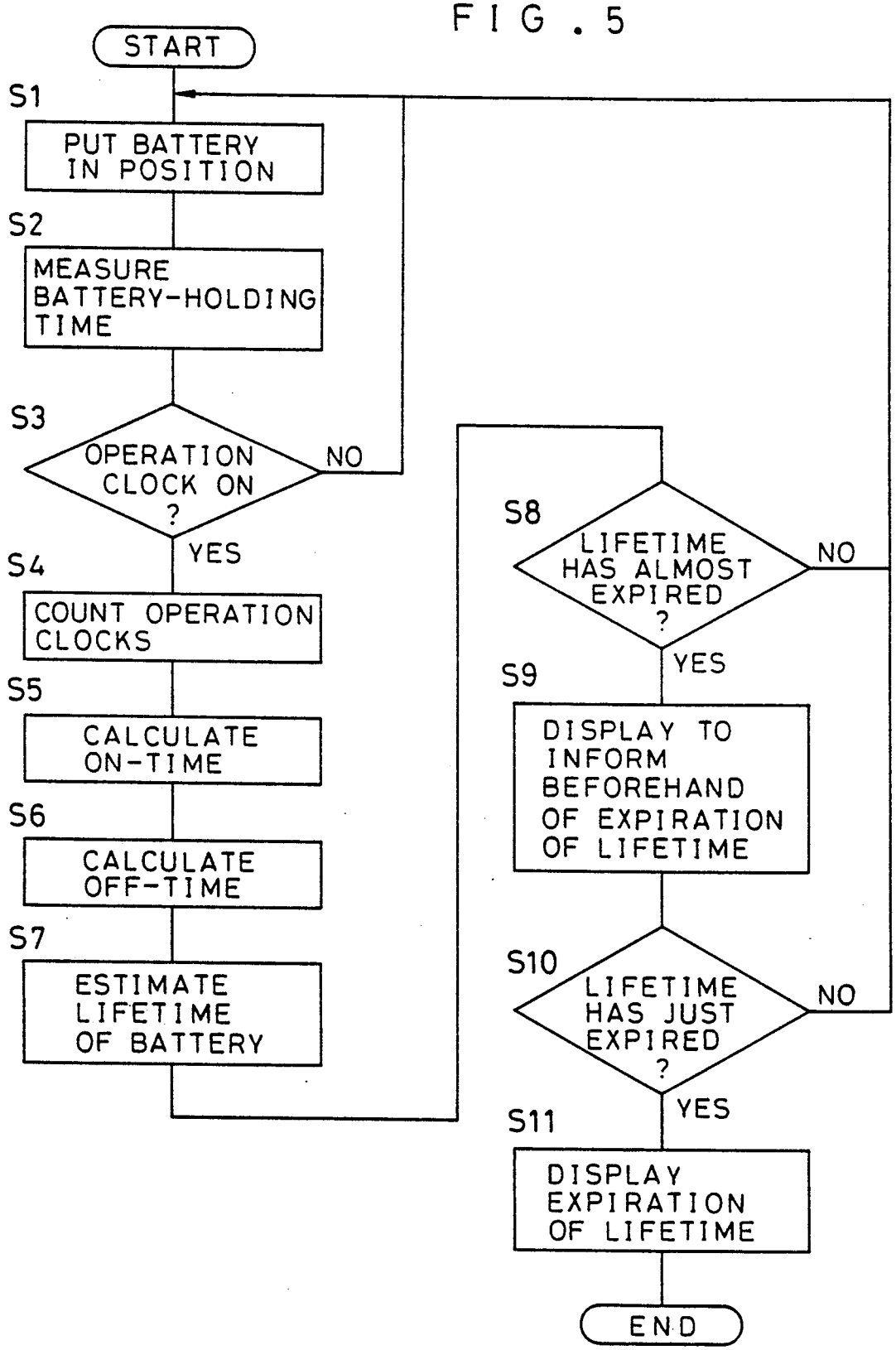
FIG. 5 is a flow chart for explaining the operation of the IC card.
Figure 6:
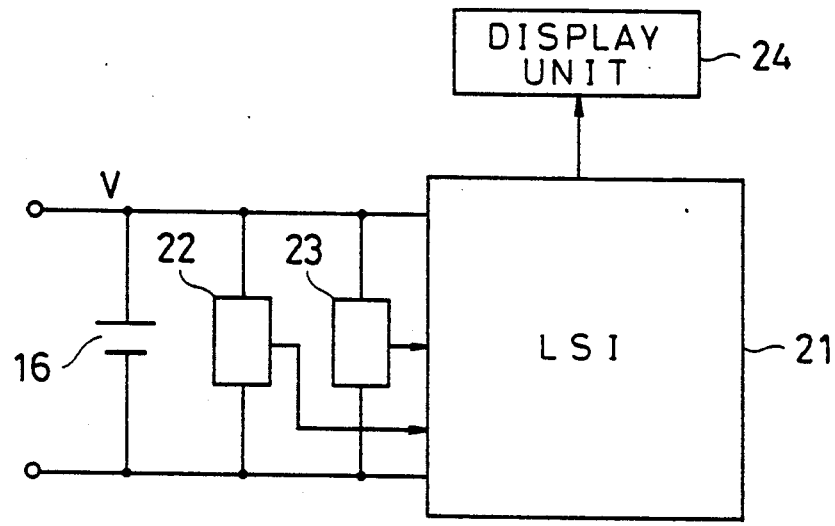
FIG. 6 is a circuit diagram showing a conventional IC card.
Figure 7:
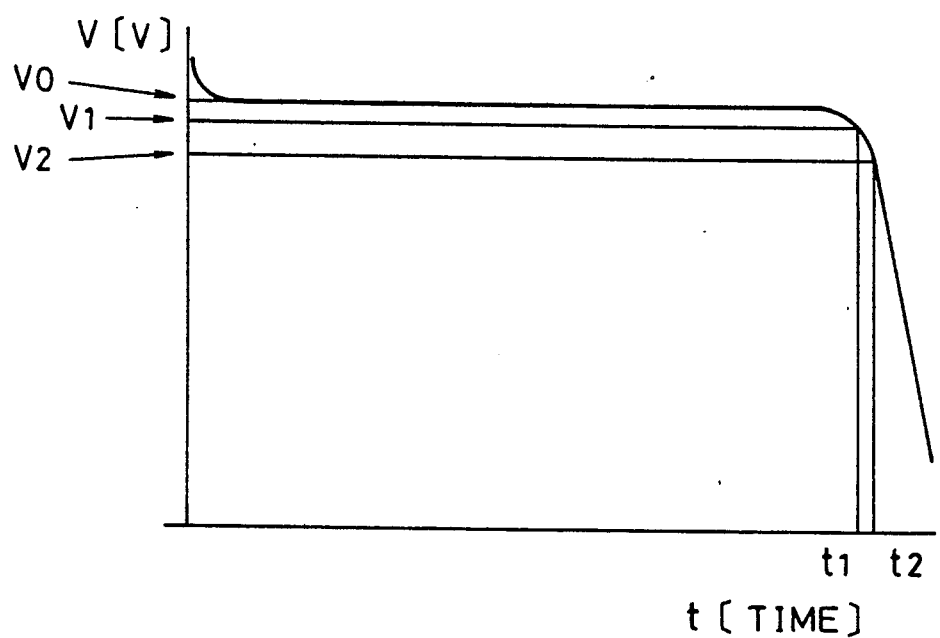
FIG. 7 is a diagram showing a discharge characteristic of a battery.

The IC card of this embodiment performs its essential function and additionally a display function for informing of the expiration of the lifetime of the battery as shown in FIG. 5. In FIG. 5, S1 to S11 denote steps of a flow chart, and they can be related to FIG. 1 in that steps S3 and S4 correspond to the counting means, step S5 to the operating means, steps S6 and S7 to the estimating means and steps S8 and S9 to the informing means, respectively.

As the battery 16 is put in position in the IC card, the timer 18 starts to measure the total time for which the battery 16 will have been held in the IC card (step S1, S2). While the IC card is on standby, the operation clock generating circuit 17 generates no operation clocks, but merely the timer 18 cumulatively measure a time for which the battery 16 has been held. While the IC card is being actuated, the counter 191 cumulatively counts the number of the operation clocks generated by the operation clock generating circuit 17 (steps S3, S4). Also the timer 18 measures the total time for which the battery 16 has been held.

A measured value of the total time for which the battery 16 has been held and accumulated number of the operation clocks are transferred to the CPU 192, and an ON-time of the operation clocks is calculated based upon the accumulated number of the operation clocks (step S5). The ON-time of the operation clocks equals to the total operating time of the IC card, which is an actual operating time of the battery 16. After the ON-time of the operation clocks is calculated, an OFF-time of the operation clocks is calculated based upon the ON-time and the total time for which the battery 16 has been held (step S6). The OFF-time of the operation clocks equals to the total time for which the IC card is on standby. Then, allowing for a consumed current during the ON-time of the operation clocks and that during the OFF-time, an actual consumption state of the battery 16 is estimated (step S7).

As it is detected, due to the estimation on the actual consumption state of the battery 16, that the lifetime of the battery 16 has reached to the expiration, the display unit 14 receives the information through the LCD driver 195 to display it before the expiration of the lifetime of the battery 16 (steps S8, S9). As the battery 16 is exchanged in accordance with the display, the procedure gets right back to step S1, and step S2 and the succeeding steps are repeated. If the battery 16 is not exchanged, when the lifetime of the battery 16 has just expired, the information is displayed by the display unit 14 (steps S10, S11). The expiration of the lifetime of the battery 16 means a state in which the voltage V of the battery 16 falls to $V_2$, and a state in which the voltage V is lower than $V_2$ leads to a malfunction in the LSI 19.

According to the above-mentioned embodiment, an actual operating time of the battery 16 is employed in estimating a consumption state of the battery 16, so that it can be predict when the lifetime of the battery 16 expires, before the voltage-fall arises in the battery 16. In this way, the display unit 14 displays to inform beforehand of the expiration of the lifetime of the battery 16 with a time to spare before the actual expiration of the lifetime. As a result, there is no possibility of being late in exchanging the battery 16, and hence the malfunction of the LSI 19 can be avoided.

In the above-mentioned embodiment, the ON-time (the real operating time of the battery 16) and the OFF-time of the operation clocks are utilized to estimate a consumption state of the battery 16, but the consumption state of the battery 16 can be estimated based simply upon the ON-time of the operation clocks. In utilizing the OFF-time of the operation clocks, the OFF-time can be obtained by a way other than that discussed in conjunction with the above embodiment. Furthermore, the present invention can be applied to an electronic equipment with a display unit energized by a battery, other than an IC card.

Since an electronic equipment according to the present invention estimates the lifetime of a battery based upon the actual operation time of the battery, as stated above, the expiration of the lifetime can be predicted early enough to be indifferent of a voltage of the battery. Thus, the electronic equipment can display to inform beforehand of the expiration of the lifetime of the battery with time to spare before the actual expiration of the lifetime. As a result, a malfunction of the electronic equipment caused by a late exchange of the battery can be avoided.

What is claimed is:

1. An electronic equipment using a battery as an energizing power source, comprising:
   a display unit;
   signal generating means for generating operation clocks while the electronic equipment is being actuated; counting means for measuring the number of the clocks; calculating means for calculating an operating time of the battery based upon the result of the counting operation by the counting means;
   timer means for measuring the total actual time for which the battery has been held in said equipment;
   means responsive to said timer means and said calculating means for determining the total off time in which said electronic equipment is unactuated;
   estimating means responsive to said calculating means and said means for determining for estimating a consumption state of the battery based upon the result of the calculation by the calculating means and the determination of off time; and
   informing means responsive to said estimating means for causing said display unit to display beforehand the expiration of the lifetime of the battery based upon the result of the estimation by the estimating means wherein said estimating means estimates a consumption state of the battery based upon current outputted from the battery while said electronic equipment is actuated and unactuated.

2. An electronic equipment according to claim 1, wherein said counting means is reset by an exchange of the battery.

3. An electronic equipment according to claim 1, wherein said timer means is reset by an exchange of the battery.

* * * * *